United States Patent [19]
Kudo et al.

[11] Patent Number: 5,523,610
[45] Date of Patent: Jun. 4, 1996

[54] PHOTODIODE ARRAY AND METHOD FOR MANUFACTURING THE SAME

[75] Inventors: Koichi Kudo; Yasuo Aki, both of Kyoto, Japan

[73] Assignee: Rohm Co., Ltd., Kyoto, Japan

[21] Appl. No.: 272,311

[22] Filed: Jul. 7, 1994

Related U.S. Application Data

[63] Continuation of Ser. No. 141,099, Oct. 26, 1993, abandoned.

[30]     Foreign Application Priority Data

Nov. 13, 1992   [JP]   Japan ..................... 4-303754

[51] Int. Cl.⁶ ............................. H01L 31/00; H01L 21/22
[52] U.S. Cl. ................. 257/443; 257/448; 257/457; 257/459; 257/465; 257/347; 257/654; 257/928; 437/141; 437/149; 437/180; 437/205; 437/916
[58] Field of Search ................................ 257/443, 448, 257/457, 459, 465, 347, 654, 928; 437/141, 180, 205, 916

[56]             References Cited

U.S. PATENT DOCUMENTS 3,690,953   9/1972   Wise .
3,745,424   7/1973   Ohuchi et al. .
3,988,774   10/1976  Cohen-Solal et al. .
3,994,012   11/1976  Warner, Jr. .

FOREIGN PATENT DOCUMENTS 5-175537   7/1993   Japan .

OTHER PUBLICATIONS

U.S. application Ser. No. 07/992,115.

*Primary Examiner*—Edward Wojciechowicz
*Attorney, Agent, or Firm*—Nikaido Marmelstein Murray & Oram

[57]             ABSTRACT

A photodiode array is provided which includes a cell comprised of at least a substrate, an insulating film formed on the substrate, a semiconductor layer containing an impurity of first conductivity type and provided on the insulating film, an impurity-diffusion layer of second conductivity type formed in the semiconductor layer and reaching the insulating film, and at least one impurity-diffusion layer of the first conductivity type formed within the impurity-diffusion layer of the second conductivity type and reaching the insulating film, wherein pn junctions are defined between the layers of opposite conductivity types and arranged laterally, and of the pn junctions, any pn junction of a predetermined order are connected to each other in series. By virtue of this arrangement, the area of pn junctions per unit area of a substrate is increased thereby contributing to a reduction in chip size and in production cost.

6 Claims, 7 Drawing Sheets

PROPOSED FORMERLY

PHOTODIODE ARRAY AND METHOD FOR MANUFACTURING THE SAME

This application is a continuation of application Ser. No. 08/141,099 filed Oct. 26, 1993 now abandoned.

BACKGROUND OF THE INVENTION

The present invention relates to a photodiode array and a method for manufacturing the same. More particularly, it relates to a photodiode array which contributes a reduction in both chip size and production cost, and to a method for manufacturing such a photodiode array.

Photodiode arrays have hitherto been used in, for example, solid state relays (SSRs). A representative example of such photodiode arrays is of a structure such as shown in FIG. 15, wherein portions of an n-type polysilicon substrate 31 are isolated from each other with a silicon oxide film 32; a p-type impurity diffusion layer 33 is formed in each of the isolated portions and, further, an $n^+$-type impurity diffusion layer 34 of high concentration is formed in the surface layer of the diffusion layer 33, so that a multiplicity of pn junctions are arranged in the substrate 31; and these pn junctions are serially connected to each other with a conductive film 36, with appropriate insulation by means of a silicon oxide film 35.

An alternative prior art photodiode is disclosed in, for example, Japanese Unexamined Patent Publication No. 22487/1991. This photodiode array is of the structure shown in FIG. 16 wherein photodiodes 24 comprising single-crystalline islands isolated from each other with a silicon oxide film 28 are formed in a dielectric-isolation substrate 23, and serially connected to each other with an aluminum wiring 25.

In either prior art array, however, the structrue thereof is complicated because the oxide film 32 or 28 for isolation is formed in the semiconductor substrate 31 or 23 and a pn junction is formed in each of the single-crystalline semiconductor islands isolated with the oxide film 32 or 28. This results in a poor yield at the production process and a rise in the price of products.

In an attempt to overcome such problems of the prior art arrays, a photodiode array wherein an impurity-doped semiconductor layer formed on a semiconductor substrate covered with an insulating film, and impurity-diffusion layers of a conductivity type opposite to that of the semiconductor layer are formed in the semiconductor layer so as to extend down to the insulating film, thereby forming pn junctions arranged laterally (refer to Japanese Patent Application No. 355876/1991) have been formerly proposed.

This photodiode array, shown in FIG. 17, is characterized by comprising a substrate 41, an insulating film 42 formed on the substrate 41, a semiconductor layer 43 doped with a first impurity and formed on the insulating film 42, second-impurity diffusion layers 44 of a polarity opposite to that of the semiconductor layer 43 which are formed in the semiconductor layer 43 so as to provide a plurality of pn junctions arranged laterally, and high-concentration diffusion layers 45 of the same polarity with the semiconductor layer 43 which are respectively formed for the pn junctions defined by the layers 43 and 44 and which are situated in the surface layer opposite to the insulating film, whereby the pn junctions arranged laterally are utilized. Since this photodiode array is of a simple structure, it offers an improvement in production yield while realizing a decrease in the price of the products.

The present invention aims to further improve the formerly-proposed photodiode array. It is, therefore, an object of the present invention to provide a photodiode array which enjoys a reduced chip size with reduced cost.

SUMMARY OF THE INVENTION

According to the present invention, there is provided a photodiode array comprising a cell comprised of at least a substrate, an insulating film formed on the substrate, a semiconductor layer containing an impurity of first conductivity type and provided on the insulating film, an impurity-diffusion layer of second conductivity type formed in the semiconductor layer and reaching the insulating film, and at least one impurity-diffusion layer of the first conductivity type formed within the impurity-diffusion layer of the second conductivity type and reaching the insulating film, wherein pn junctions are defined between the layers of the opposite conductivity types and arranged laterally, and of the pn junctions, any pn junctions of a predetermined order are connected to each other in series.

In the photodiode array of the present invention, preferably, with respect to the pn junctions arranged laterally, any Dn junctions of which polarity for generation of electric charge is opposite in order to a polarity for use are each short-circuited by means of a thin film electrode layer while any junctions of a predetermined order, pn or np, are connected to each other in series.

Further, preferably, a shallow diffusion region is formed in a surface of the semiconductor layer in which, of said Dn junctions arranged laterally, any pn junction lies of which polarity for generation of electric charge is a polarity for use, thereby increasing the area of necessary pn junctions.

Still further, it is preferable that the pn junctions are formed concentrically in the cell.

According to the present invention, there is also provided an integrated circuit device comprising the photodiode array described above which is integrated with other semiconductor elements.

According to the present invention, there is still also provided a method for manufacturing a photodiode array, comprising the steps of:

(a) forming an insulating film on a surface of a semiconductor substrate;

(b) joining the semiconductor substrate having the insulating film with a second semiconductor substrate containing an impurity of first conductivity type;

(c) polishing a surface of the second semiconductor substrate to form a semiconductor layer containing the impurity of the first conductivity type;

(d) diffusing an impurity of second conductivity type from a surface of the semiconductor layer to the insulating film to form an impurity-diffusion layer of the second conductivity type;

(e) further diffusing the impurity of the first conductivity type within the impurity-diffusion layer of the second conductivity type so as to extend to the insulating film to form an impurity-diffusion layer of the first conductivity type, thereby forming pn junctions arranged laterally;

(f) forming a shallow diffusion region of a high concentration in a surface of the semiconductor layer in which, of the pn junctions arranged laterally, any pn junction lies of which polarity for generation of electric charge is the same in order as a polarity for use; and (g) forming a thin film electrode layer on a surface of the semiconductor layer in which, of the pn junctions arranged laterally, any pn junction lies of which polarity for generation of electric charge is opposite in order to a polarity for use thereby short-circuiting that pn junction.

In the photodiode array of the present invention, the semiconductor layer containing an impurity of the first impurity type is formed on the substrate with the insulating film sandwiched therebetween, the impurity-diffusion layer of the second conductivity type is formed in the semiconductor layer down to the insulating film, and further the impurity-diffusion layer of the first conductivity type is formed within the impurity-diffusion layer of the second conductivity type, whereby pn junctions are formed laterally. By virtue of this arrangement, the area of pn junctions unit area is increased.

In the manufacturing method for a photodiode array of the present invention, the photodiode array described above can be manufactured without requiring a complicated production procedure.

DETAILED DESCRIPTION

A photodiode array and a manufacturing method therefor according to the present invention will now be described with reference to the attached drawings.

Figure 1:
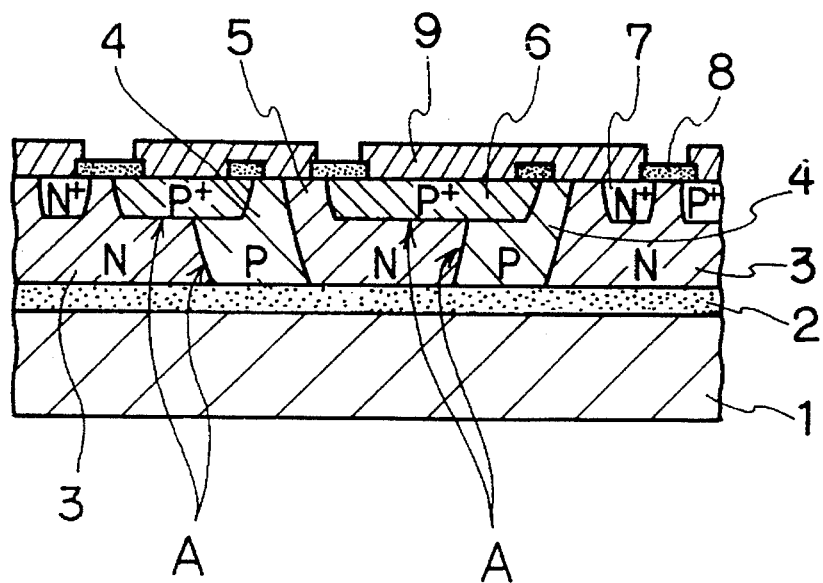
FIG. 1 is a longitudinal sectional view showing an embodiment of a photodiode array according to the present invention.

In FIG. 1, numeral 1 denotes a semiconductor substrate such as made of silicon. The semiconductor substrate 1 has a sufficient strength for supporting an active layer to be stacked thereon. Specifically, the substrate 1 is usually 200 to 500 μm thick.

On the semiconductor substrate 1, there is formed an insulating film 2 of about 0.1 to about 1 μm thickness which is composed of a silicon oxide film, silicon nitride film or the like.

Numeral 3 denotes a semiconductor layer bonded on the insulating film 2. The semiconductor layer 3 contains an impurity of first conductivity type, for example, of n-type and is polished to have a thickness of 5 to 20 μm after bonded so as to restrict the depth of diffusion to be made. In the n-type semiconductor layer 3, there are formed a plurality of impurity-diffusion layers 4 of second conductivity type, for example, of p-type, each extending down to the insulating film 2, so that a plurality of pn junctions are arranged laterally. The width of each p-type diffusion layer 4 in the longitudinal direction is set within a range of from about 20 to about 100 μm. The diffusion layers 4 are spaced from each other so that the respective diffusion layers of adjacent cells will not be brought into contact with each other.

Within each of the p-type diffusion layers 4, there is formed an impurity-diffusion layer of n-type, i.e, of the first conductivity type, which also extends down to the insulating film 2, so that a plurality of pn junctions arranged laterally are further formed within the p-type diffusion layer 4.

The pn junctions are defined between the semiconductor layer 3 of the first conductivity type, impurity-diffusion layer 4 of the second conductivity type formed in the semiconductor layer 3, and impurity-diffusion layer 5 of the first conductivity type further formed in the diffusion layer 4. Of these pn junctions, any junctions of which polarity for generation of electric charge is the same in order as the polarity for use are each provided with an impurity-diffusion layer 6 of high concentration ($p^+$-type in this embodiment), which formed in a surface of the semiconductor layer 3 on the side opposite to the insulating film 2. Herein, the definition "the polarity for generation of electric charge is the same in order as the polarity for use" indicates any pn junction of which lefthand side is of n-type and righthand side is of p-type when the leftmost electrode in the construction shown in FIG. 1 is used as negative electrode and the rightmost electrode as positive electrode (refer to the junction indicated by reference character A in FIG. 1). When the polarity for use is reversed, it indicates any pn junction of which lefthand side is of p-type and righthand side is of n-type. The definition "the polarity for generation of electric charge is opposite in order to the polarity for use" indicates any pn junction having a feature opposite to that described above. The high-concentration $p^+$-type diffusion layer 6 is made shallow, or as deep as about 1 to about 3 μm, and serves to increase the area of the pn junction A so as to increase the light-receiving area.

Also, a high-concentration impurity-diffusion layer 7 of $n^+$-type is formed in a surface of the semiconductor layer 3 on the side opposite to the insulating film 2. This diffusion layer 7 is for providing an ohmic contact between the n-type layer and an electrode to be formed thereon. The diffusion depth of this layer 7 is usually 1 to 3 μm.

Numeral 8 denotes a protective layer formed on the n-type semiconductor layer 3. The thickness of the protective layer 8 is preferably the range of from 0.1 to 1 μm in view of isolation by insulator. Suitable as the protective film is a film having an insulating property and appropriate transparency.

Contact holes are provided in the protective film 8, and, through these contact holes, any pn junctions of which polarity for generation of electric charge is opposite in order to the polarity for use are each short-circuited by means of a thin film electrode 9 formed of a conductor metal such as alumium or aluminum alloy. The thickness of the thin film electrode 9 is not particulary limited but is usually in the range of from 1.0 to 3.0 μm.

To be described next is a method for manufacturing a photodiode array according to the present invention.

Figure 3:
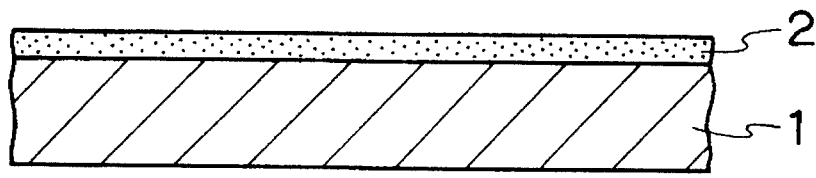
FIGS. 3 to 14 are each an explanatory sectional view for illustrating a step of the manufacturing procedure for the embodiment shown in FIG. 1.

First, an insulating film 2 of an oxide is formed on a semiconductor substrate 1 (refer to FIG. 3). Specifically, a silicon oxide film is formed to have a thickness of 0.1 to 1 μm on a semiconductor substrate such as made of silicon by CVD process or thermal oxidation process.

Figure 4:
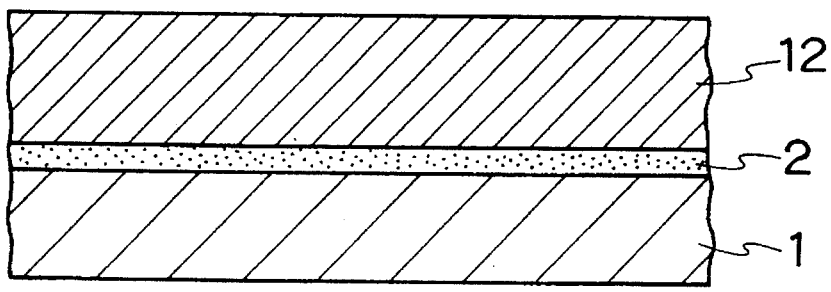

In turn, another semiconductor substrate 12 of first conductivity type (for example, of n-type) is mated back to back with the semiconductor substrate 1 formed with the insulating film 2. The substrate 12 is not formed with an oxide film. The two mated substrates are placed in a slot of a quartz boat, and heated in a furnace for diffusion at 900° to 1000° C. for a predetermined time under an atmosphere of $O_2$ gas or water vapor, thereby bonding the two substrate to each other (refer to FIG. 4).

Figure 5:
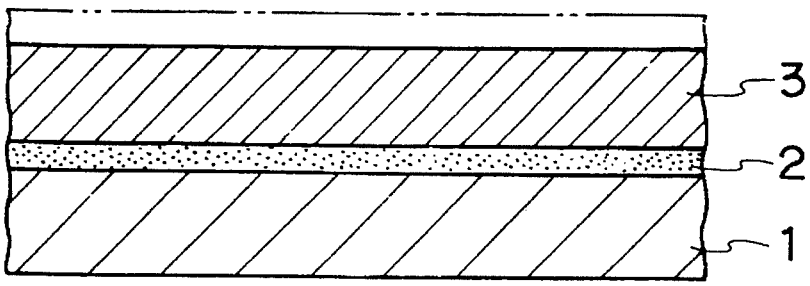

Subsequently, the surface of the n-type semiconductor substrate 12 is polished until the thickness thereof, from the insulating oxide film 2 to the surface of the substrate 12, is reduced to 5 to 20 μm. The n-type semiconductor substrate 12 bonded to the substrate 1 is used as an n-type semiconductor layer 3 (refer to FIG. 5).

Figure 6:
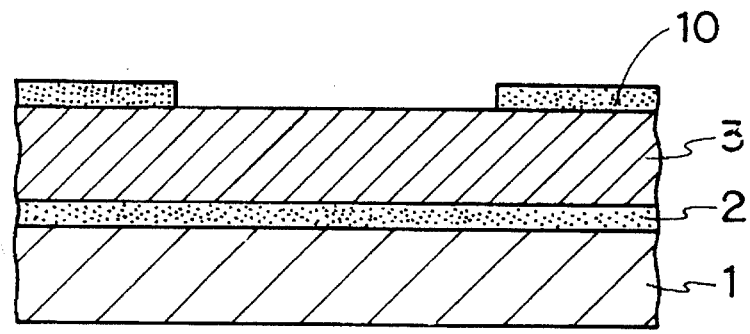

Next, a silicon oxide film 10 is formed on the surface of the n-type semiconductor layer 3. The oxide film 10 in a predetermined region is then removed using a mask for p-type diffusion to form a selective diffusion pattern (refer to FIG. 6).

Figure 7:
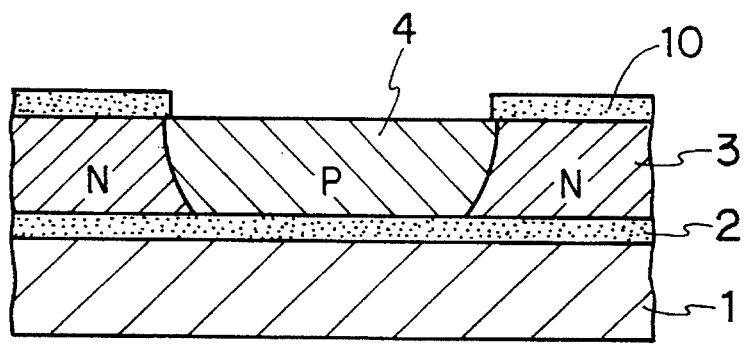

In turn, a p-type impurity-diffusion layer 4 is formed in the n-type semiconductor layer 3 using the silicon oxide film 10 thus patterned as a mask (refer to FIG. 7).

Figure 8:
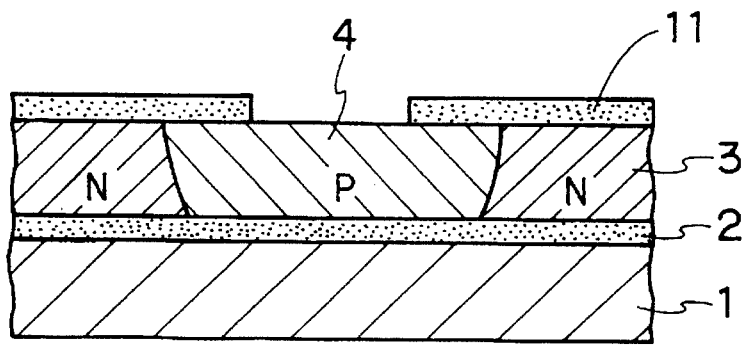

Similarly, a silicon oxide film 11 is further formed on the surface of the p-type diffusion layer 4, followed by removing the silicon oxide film 11 in a predetermined region with use of a mask for n-type diffusion to form a selective diffusion pattern (refer to FIG. 8).

Figure 9:
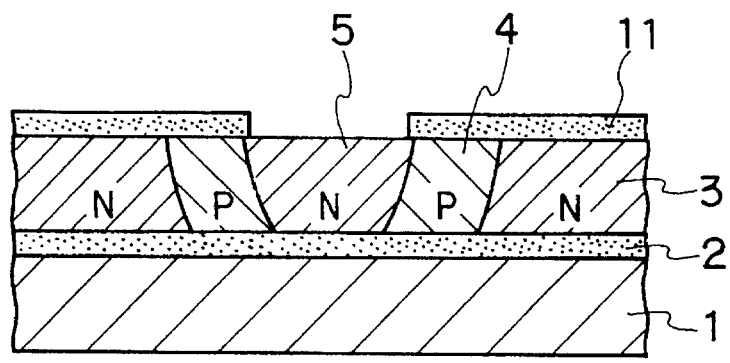

Subsequently, using the thus patterned silicon oxide as a mask, an n-type impurity-diffusion layer 5 is formed within the p-type diffusion layer 4 concentrically (refer to FIG. 9).

Figure 10:
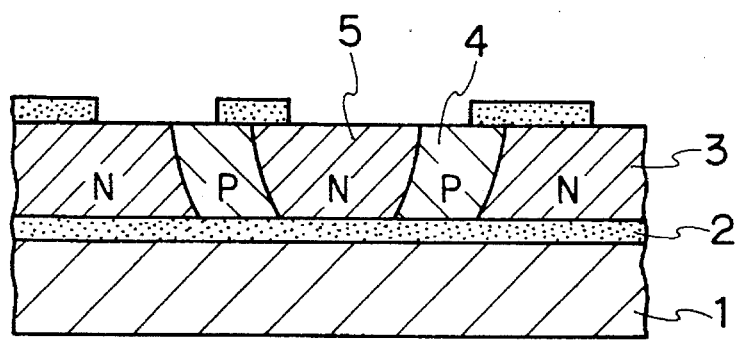
Figure 11:
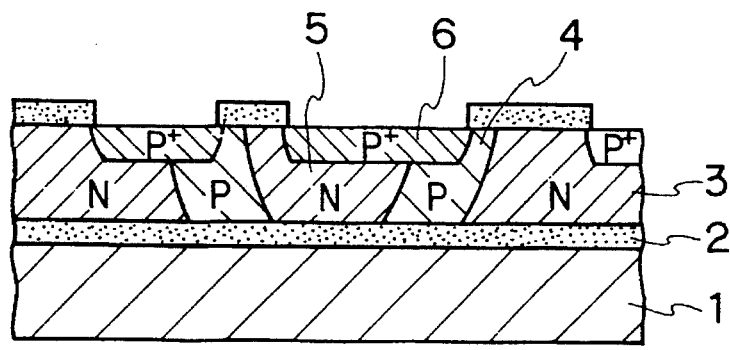
Figure 12:
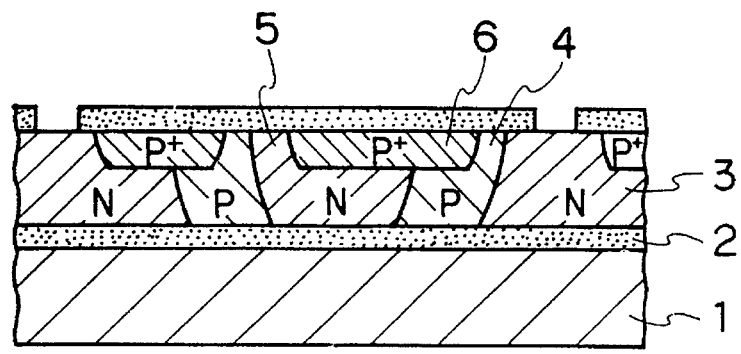
Figure 13:
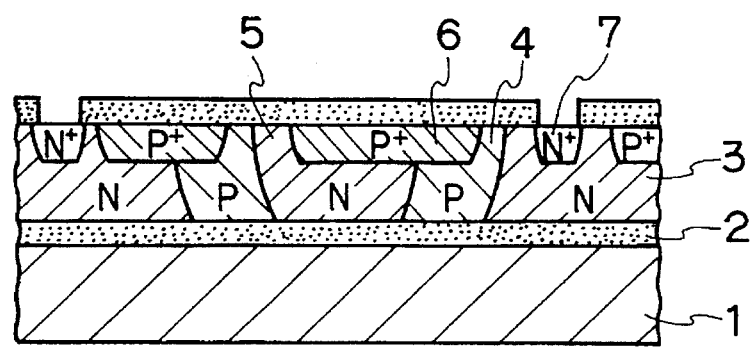

Further, for increasing the light-receiving area of pn junction as described above, a $p^+$-type impurity-diffusion layer 6 of high concentration is formed in a predetermined region of the concentric surface formed by the p-type diffusion layer and n-type diffusion layer with use of a mask of a predetermined shape (refer to FIGS. 10 and 11). Similarly, an $n^+$-type impurity-diffusion layer 7 for providing an ohmic contact between an electrode and the n-type semiconductor layer 3 is formed (refer to FIGS. 12 and 13).

Figure 14:
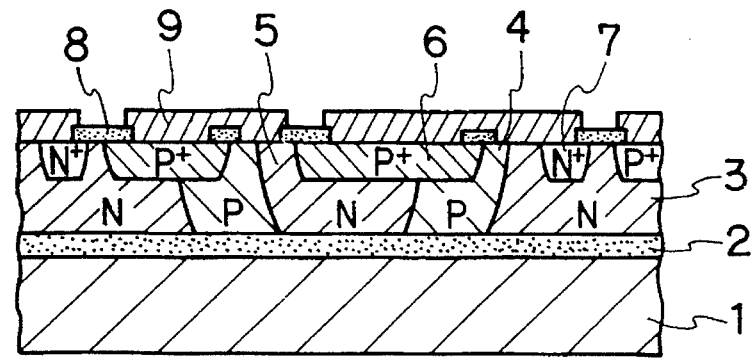
Figure 15:
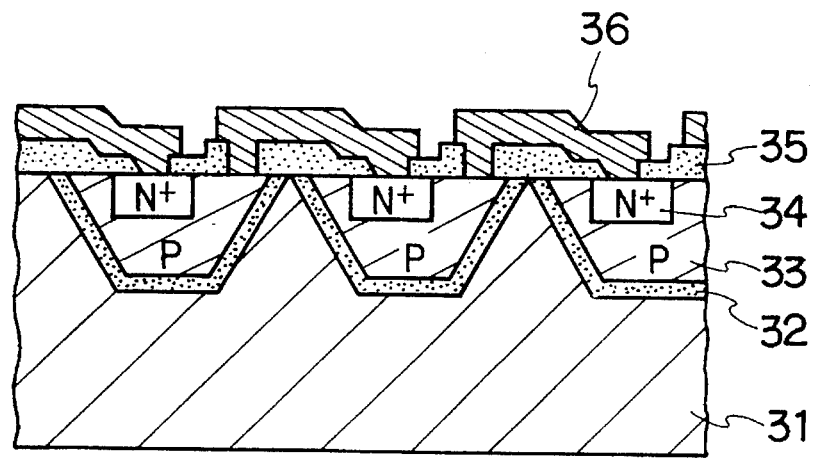
FIGS. 15 and 16 are each a longitudinal sectional view showing a prior art photodiode array.
Figure 16:
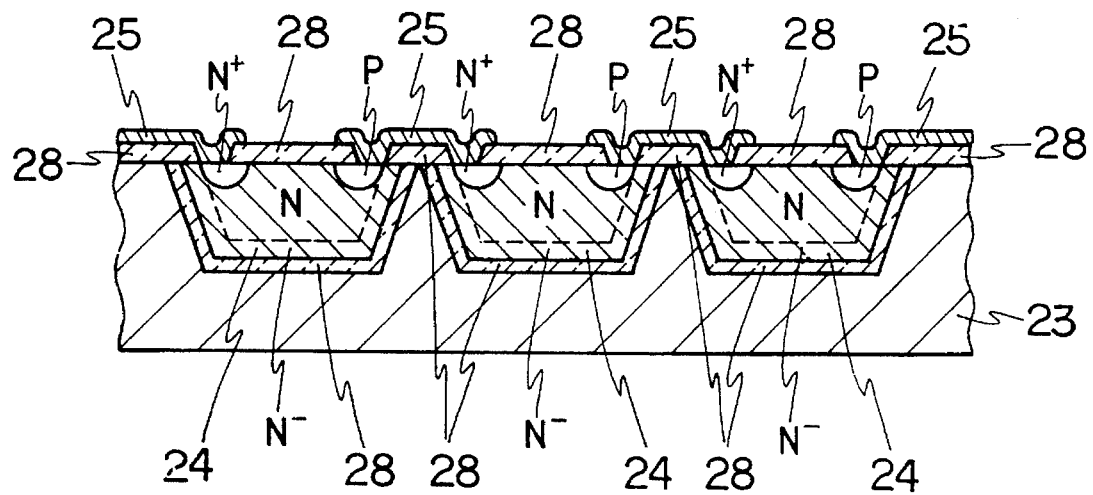
Figure 17:
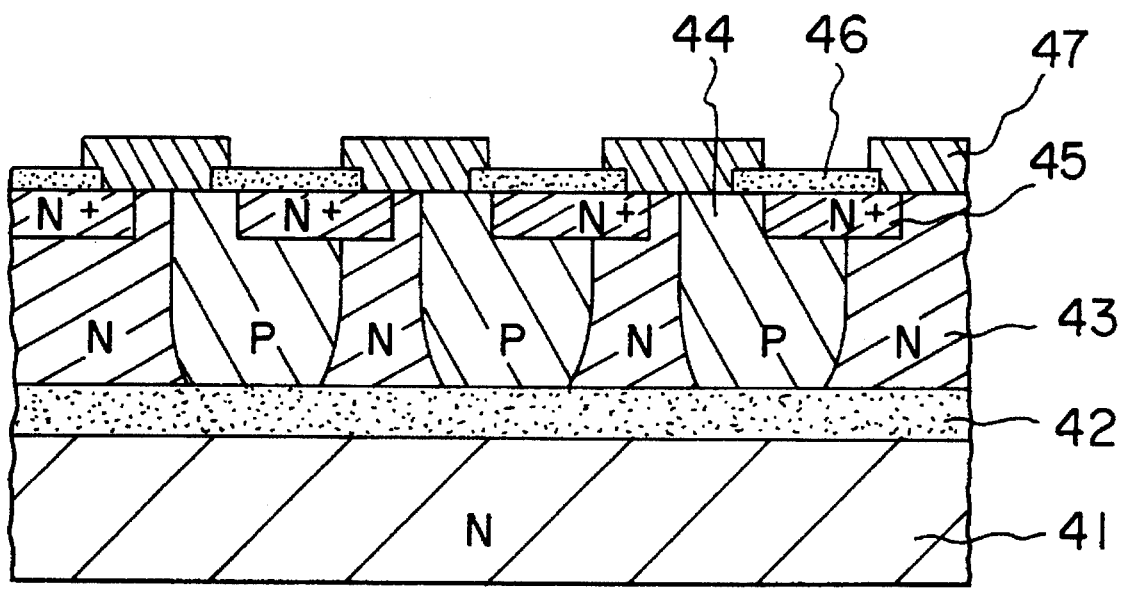
FIG. 17 is a longitudinal sectional view showing an improved photodiode array which is proposed formerly.

In turn, contact holes are formed in predetermined regions with use of a rectangular mask. An electrode material is deposited to form a film by vapor deposition or sputtering, followed by patterning the film to form a thin film electrode film 9 on the n-type semiconductor layer 3. This electrode film is appropriately insulated by a protective film 8 such as made of a silicon oxide film (refer to FIG. 14).

Finally, a surface protective layer, bonding pad and the like are formed in a manner similar to the conventional photodiode manufacturing method, to complete a photodiode array.

In the above description, the photodiode array is constructed by forming the p-type diffusion layer in the n-type semiconductor layer and further the n-type diffusion layer within the p-type diffusion layer. However, the semiconductor layer for use in the present invention is not limited to an n-type semiconductor layer but a p-type semiconductor layer is also suitable. When the p-type semiconductor layer is used, as a matter of course the conductivity types of the diffusion layers to be formed therein need to be reversed. Further, the number of impurity-diffusion layers of p-type and n-type to be formed in the semiconductor layer is not limited to two but it may be more than two. In the above embodiment of the manufacturing method, the insulating film 2 and the masks 10 and 11 for diffusion are each formed of a silicon oxide film. However, a silcon nitride film or an insulating film of another type may be used to form them.

Further, the structure shown in FIG. 1 of the above embodiment, the left side electrode and the right side electrode are used as negative and positive electrodes, respectively, to utilize any pn junction of which lefthand side is of n-type and righthand side is of p-type. However, the polarities of the electrodes may be reversed to utilize any pn junction of which lefthand side is of p-type and righthand side is of n-type. In this case, any pn junction of which lefthand side is of n-type and righthand side is of p-type is short-circuited at the surface thereof by the thin film electrode layer.

Figure 2:
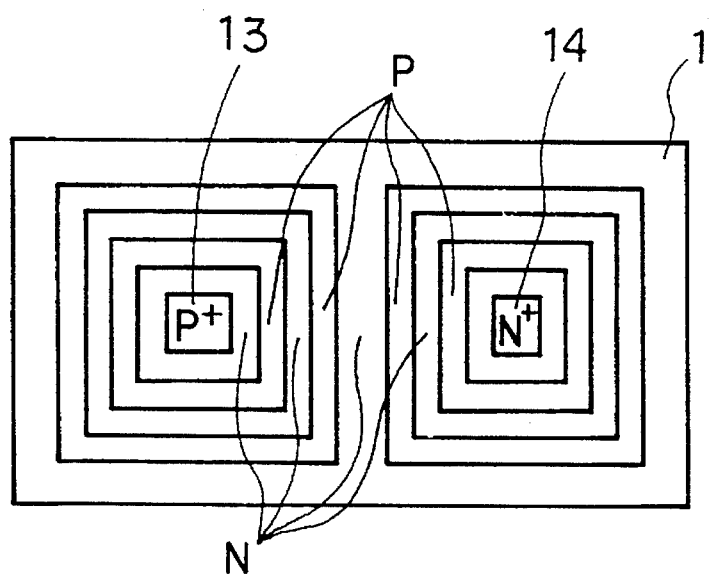
FIG. 2 is an explanatory plan view showing a surface pattern of the embodiment shown in FIG. 1.

Also in the above embodiment, the p-type impurity-diffusion layer is formed in the n-type semiconductor layer and, in turn, the n-type impurity diffusion layer is formed within the p-type impurity-diffusion layer. However, p-type and n-type impurities may be further diffused alternately as pnpn . . . to form a concentric configuration of pn junctions as shown in FIG. 2 thereby assuring an increased area of pn junctions in a small area of a semiconductor substrate. In FIG. 2, when the $p^+$-region 13 is used as a positive electrode and the $n^+$-region as a negative electrode, a photodiode having five pn junctions connected in series is obtained.

If the photodiode array thus contructed and other semiconductor elements are formed on the same semiconductor substrate, then a semiconductor integrated circuit device can be readily obtained.

As has been described, in the photodiode array of the present invention, an impurity-diffusion layer of second conductivity type is formed in a semiconductor layer having an impurity of first conductivity type, and further, an impurity-diffusion layer of the first conductivity type is formed within the impurity-diffusion layer of the second conductivity type. These diffusion layers may be repeatedly formed to form a concentric configuration of pn junctions. Therefore, the number of pn junctions which are formed in the same area can be increased. This contributes to a reduction in chip size and in production cost.

Though several embodiments of the present invention are described above, it is to be understood that the present invention is not limited only to the above-mentioned, various changes and modifications may be made in the invention without departing from the spirit and scope thereof.

What is claimed is:

1. A photodiode array comprising a cell comprised of at least a substrate, an insulating film formed on the substrate, a semiconductor layer containing an impurity of first conductivity type and provided on the insulating film, an impurity-diffusion layer of second conductivity type formed in the semiconductor layer and reaching the insulating film, and at least one impurity-diffusion layer of the first conductivity type formed within the impurity-diffusion layer of the second conductivity type and reaching the insulating film, wherein pn junctions are defined between the layers of opposite conductivity types and arranged laterally, the pn junctions each comprise a first pn junction conductivity type and a second pn junction conductivity and of the pn junctions, pn junctions extending in a lateral direction are connected to each other in series such that a first junction conductivity type of a first pn junction is connected to a second pn junction conductivity type of a second pn junction, wherein the impurity-diffusion layer of the second conductivity type is surrounded by the diffusion layer containing an impurity of the first conductivity type.

2. The photodiode array of claim 1, wherein of said pn junctions arranged laterally, wherein when said first pn junction conductivity type of said first pn junction is a same conductivity type as said second pn junction, conductivity type of said second pn junction, said first and second pn junctions are short-circuited by means of a thin film electrode layer.

3. The photodiode array of claim 1 or claim 2, further comprising a shallow diffusion region formed in a surface of said semiconductor layer.

4. The photodiode array of claim 1, wherein said pn junctions are formed concentrically in said cell.

5. An integrated circuit device comprising the photodiode array of claim 1 which is integrated with other semiconductor elements.

6. A method for manufacturing a photodiode array, comprising the steps of:
- (a) forming an insulating film on a surface of a semiconductor substrate;
- (b) joining the semiconductor substrate having the insulating film with a second semiconductor substrate containing an impurity of first conductivity type;
- (c) polishing a surface of the second semiconductor substrate to form a semiconductor layer containing the impurity of the first conductivity type;
- (d) diffusing an impurity of second conductivity type from a surface of the semiconductor layer to the insulating film to form an impurity-diffusion layer of the second conductivity type;
- (e) further diffusing an impurity of the first conductivity type within the impurity-diffusion layer of the second conductivity type so as to extend to the insulating film to form an impurity-diffusion layer of the first conductivity type, thereby forming pn junctions arranged laterally;
- (f) forming a shallow diffusion region of a high concentration in a surface of the semiconductor layer, thereby forming a second pn junction arranged laterally, said second pn junction having a first polarity for generation of electric charge; and
- (g) forming a thin film electrode layer on a surface of the semiconductor layer, thereby forming third pn junction arranged laterally, said third pn junction having a second polarity for generation of electric charge opposite in order to the first polarity thereby short-circuiting that pn junction.

* * * * *